United States Patent [19]

Bose

[11] Patent Number: 4,538,298
[45] Date of Patent: Aug. 27, 1985

[54] FIXED BANDPASS TONE CONTROLLING

[75] Inventor: Amar G. Bose, Wayland, Mass.

[73] Assignee: Bose Corporation, Framingham, Mass.

[21] Appl. No.: 428,148

[22] Filed: Sep. 29, 1982

[51] Int. Cl.³ .............................................. H03G 5/00
[52] U.S. Cl. ..................................... 381/98; 381/101; 333/28 T
[58] Field of Search ................ 381/98, 101, 103, 102; 333/28 T; 84/DIG. 9; 455/267; 179/107 FD

[56] References Cited

U.S. PATENT DOCUMENTS

| 2,121,150 | 6/1938 | Jarvis | 333/28 T X |
| 2,137,633 | 11/1938 | Stocker | 381/101 X |
| 2,900,609 | 8/1959 | Estkowski | 333/28 T |
| 3,531,596 | 9/1970 | Yagher, Jr. | 381/98 |
| 3,816,661 | 6/1974 | Huszty et al. | 381/101 |
| 4,320,534 | 3/1982 | Sakai et al. | 333/28 T X |

OTHER PUBLICATIONS

Oliver Read, "The Recording and Reproduction of Sound", 1st Ed., 1949, Howard W. Sams & Co., Indianapolis, Ind., pp. 194-196.

Primary Examiner—Keith E. George
Attorney, Agent, or Firm—Charles Hieken

[57] ABSTRACT

A tone control has a transfer function characterized by a zero and pole on the real axis spaced from the imaginary axis by an audible frequency with adjustment of a potentiometer causing one of the zero and pole to slide along the real axis while the other remains stationary. A treble control with fixed pole at 1 kHz from the imaginary axis has a potentiometer connected to an input terminal with its arm connected to an output terminal and is in series with a resistor and capacitor between the input terminal and ground. A bass cut control has a capacitor connected to an input terminal in series with a resistor between the input terminal and ground. The capacitor is shunted by a potentiometer having its arm connected to an output terminal. A treble tone control circuit with both cut and boost has a center tapped potentiometer with first and second opposed ends connected to + inputs of first and second operational amplifiers, each having a feedback connection with the − input. First and second capacitors connect the outputs of the first and second operational amplifiers, respectively, to the − input of a third operational amplifier. The series combination of first and second resistors connect the − input of the third operational amplifier to the + input of the first operational amplifier and the serial combination of third and fourth resistors connect the − input of the third operational amplifier to the + input of the second operational amplifier. There is a feedback connection with the output of the third operational amplifier to the junction of the first and second resistors. The wiper of the tapped potentiometer, the tap of the potentiometer and the + input of the third operational amplifier are connected to a common line.

4 Claims, 7 Drawing Figures

FIXED BANDPASS TONE CONTROLLING

The present invention relates in general to tone controlling and more particularly concerns novel apparatus and techniques for effecting a desired change in the frequency response characteristic of a sound reproduction system, particularly in the treble and bass regions with apparatus that is relatively free from complexity and provides a pleasing alteration of the frequency response characteristic. The invention is especially advantageous as treble and bass controls that function to substantially uniformly attenuate spectral components above and below, respectively, predetermined break frequencies.

The purpose of tone controls is to alter the frequency response in a manner that is either pleasant to the listener, or complementary to the action of other elements of the music reproduction system. Most tone controls have a flat response in the middle range of audio frequencies, and a variable region at the high end or low end of the audible spectrum which may be boosted or cut by operating the control. Break frequencies define the ends of the flat region of response.

The break frequencies are defined by real poles and zeros in the transfer function for cutting and boosting, respectively. While a tone control may have additional poles and zeroes (singularities) in its transfer function, the singularity closest to the center of the audible spectrum, typically considered to be 800 Hz, determines the break frequency.

Moving a typical prior art tone control from neutral position changes the break frequency. These prior art tone controls generally fit within two categories. In the first, the break frequency is at the extreme of the audible spectrum in the neutral position, and changing the control from neutral moves the break frequency into the audible spectrum. This type of control may have extra singularities to convert it into a "shelving control". In the second type, the break frequency starts off somewhat into the audible range with the control in the neutral position, and changing the control from neutral moves the break frequency further into the audible range. This type of control always has additional singularities to provide a "shelving" effect.

Another type of frequency-compensating circuit is a graphic or parametric equalizer, which employs singularities the magnitude of whose complex frequency remains constant. These equalizers are not generally considered tone controls, usually employ complex singularities and have a flat response both above and below the frequency region controlled. These equalizers are much more complex to use and have no "break frequency" as such.

The prior art tone control approach in which the break frequency changes as the control is adjusted is disadvantageous. If the problem to be corrected by the tone control is in a particular region of the spectrum, the prior art control will have no effect upon that region until it is adjusted to a point where the break frequency is near that region, and then will have an increasing effect upon that region only at the expense of effecting other regions as well.

One problem not infrequently encountered is the harshness created in a sound production system by an excess of direct energy radiation from the loudspeaker to the listener. It has been discovered that this harshness can be substantially reduced by introducing a negative slope in the frequency response in the region of approximately 1 to 5 kHz. With a conventional tone control, there would only be one setting which would locate the break frequency at 1 kHz, and this setting typically results in providing too much or too little attenuation above that frequency. With a graphic or parametric equalizer, multiple controls would have to be employed to achieve the desired harshness reduction.

Many sound reproducing systems, including the environment in which the sound is reproduced, tend to have a frequency response which rises as a function of frequency in the region from two to five kHz. A rising slope of the frequency response in this region seems to be objectionable to many listeners and seems to cause listening fatigue. Again, prior art tone controls do not ordinarily compensate for this effect except when the control is adjusted to the unique position with the break at 1 kHz.

It is an important object of this invention to provide improved tone controlling.

According to the invention, there is means for establishing a transfer characteristic characterized by a pole and a zero on the real axis in the frequency domain, and control means for effectively moving one of the poles and zeros along the real axis while the other remains stationary at a distance from the imaginary axis. An additional feature of this invention is that the fixed singularity is the one which establishes the break frequency, e.g., the one closest to the center of the audible range. In specific forms of the invention the control circuits comprise the series combination of a resistor and a capacitor coupled to a potentiometer. For a treble cut control the potentiometer is connected in series between an input terminal and the resistor-capacitor series combination that is connected to a common terminal, and the output is taken between the arm of the potentiometer and the common terminal. In a bass cut control the capacitor is connected to the input terminal with the resistor connected to the common terminal, and the potentiometer is connected across the capacitor. The output is derived between the arm of the potentiometer and the common terminal.

Numerous other features, objects and advantages of the invention will become apparent from the following specification when read in connection with the accompanying drawing in which.

Figure 1:
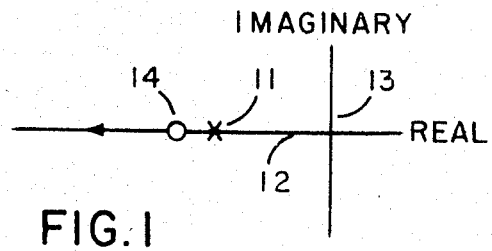
FIG. 1 is a graphical representation of the location of the fixed pole and sliding zero on the real axis in the complex frequency plane.

With reference now to the drawing and more particularly FIG. 1 thereof, there is shown the sliding zero-fixed pole pattern on the real axis of the transfer function of a treble control according to the invention in the complex frequency plane. A fixed pole 11 is located on real axis 12 spaced from imaginary axis 13 by a frequency corresponding substantially to the break frequency of the transfer function. Operating the tone control causes a sliding zero 14 to slide along the real axis away from imaginary axis 13 to attenuate spectral components above the break frequency, attenuation increasing as the zero slides further away from the fixed pole.

Figure 2:
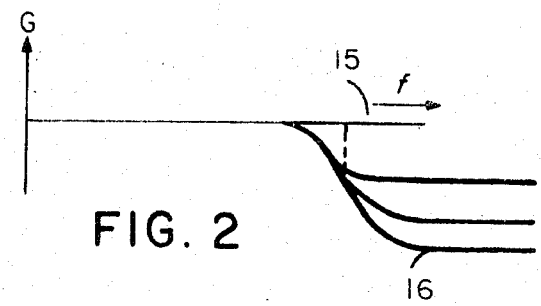
FIG. 2 is a graphical representation of the frequency response for different displacements of the sliding zero from the fixed pole.

Referring to FIG. 2, there is shown a graphical representation of the attenuation as a function of frequency for the fixed pole sliding zero pattern of FIG. 1 for different displacements of sliding zero 14 from fixed pole 11. When sliding zero 14 coincides with fixed pole 11, the response is substantially uniform as represented by curve 15. When sliding zero 14 is a maximum distance away from fixed pole 11, there is maximum cut exemplified by response curve 16.

Figure 3:
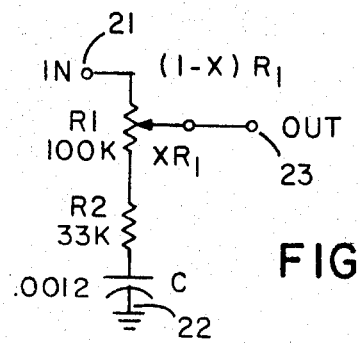
FIG. 3 is a schematic circuit diagram of an exemplary embodiment of the invention functioning as a treble control.

Referring to FIG. 3, there is shown a schematic circuit diagram of a treble tone cut control characterized by the fixed pole 11 and sliding zero 14 on the real axis to produce the set of transfer response curves shown in FIG. 2. The treble tone control circuit comprises an input terminal 21, a common or ground terminal 22 and an output terminal 23. The arm of potentiometer $R_1$ is connected to output terminal 23. Potentiometer $R_1$ is connected in series with resistor $R_2$ in series with capacitor C. Designating the fractional rotation of the arm of potentiometer $R_1$ as X, the resistance between the arm of potentiometer $R_1$ and input terminal 21 is $(1-X) R_1$ and that between the arm and resistance $R_2$ is $XR_1$.

If $V_O$ is the voltage out on output terminal 23 and $V_I$ is the voltage in at terminal 21, the transfer function $V_O/V_I=(XR_1+R_2)sC+1/(R_1+R_2)sC+1$. The stationary pole is thus $f_p=\frac{1}{2}\pi(R_1+R_2)C$ and the sliding zero is $f_z=\frac{1}{2}\pi(XR_1+R_2)C$. At the maximum fractional rotation of potentiometer $R_1$ there is a flat response for $X=1$ with $f_p=f_z$. At the minimum setting of potentiometer $R_1$ when $X=0$, $f_z=\frac{1}{2}\pi R_2C$. The cut in decibels for frequencies significantly above $f_z$ is 20 log $f_p/f_z$, and for the minimum is 20 log $R_2/(R_1+R_2)$. A convenient location for the fixed pole is 1 kHz for a treble control.

This embodiment of the invention produces audibly perceptible improvements over conventional tone controls which typically provide more attenuation with increasing frequency during cut. The present invention uniformly attenuates frequencies above the second break frequency corresponding substantially to $f_z$. The progressively increasing attenuation between $f_p$ and $f_z$ has been found to be subjectively pleasing to listeners. The control structure is relatively easy and inexpensive to fabricate while providing these advantageous results. This characteristic thus provides an offsetting negative slope in the frequency region 2-5 kHz where many sound reproducing systems have a rising slope that seems to be objectionable to many listeners and seems to cause listening fatigue.

Figure 4:
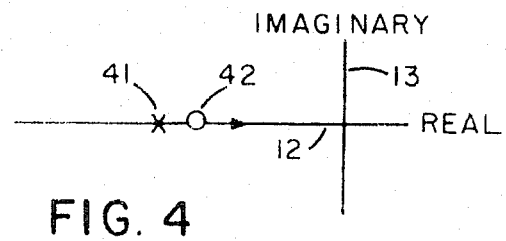
FIG. 4 is a representation of the sliding zero along the real axis with a fixed pole for a bass control.
Figure 5:
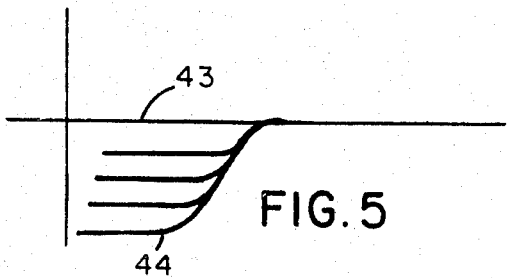
FIG. 5 is a graphical representation of the frequency response for different displacements of the sliding zero from the fixed pole.

Referring to FIG. 4, there is shown the fixed pole 41 and sliding zero 42 on real axis 12 moving toward imaginary axis 13 to produce the bass cut response shown in FIG. 5. When fixed pole 41 and sliding zero 42 coincide, the response is substantially uniform as represented by curve 43. When sliding zero 42 is a maximum distance away from fixed pole 41, curve 44 results to produce maximum bass cut.

Figure 6:
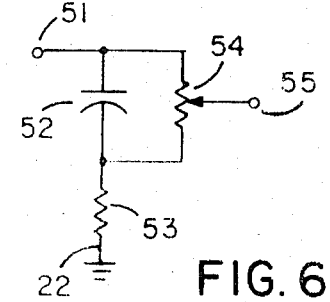
FIG. 6 is a schematic circuit diagram of an exemplary embodiment of the invention for use as a bass control.

Referring to FIG. 6, there is shown a schematic circuit diagram of an embodiment of the invention having the fixed pole sliding zero pattern of FIG. 4 to produce the bass cut response shown in FIG. 5. A capacitor 52 in series with a resistor 53 is connected between input terminal 51 and common terminal 22. A potentiometer 54 shunts capacitor 52. Output terminal 55 is connected to the arm of potentiometer 54 to produce the output between terminal 55 and common terminal 22. A typical location for the fixed pole 41 for a bass cut control is 400 Hz, and sliding zero 42 moves toward imaginary axis 13 as the arm of potentiometer 55 is moved closer to resistor 53.

The invention was described above only in connection with cut controls. For boost the zero is fixed, and the pole slides away from the imaginary axis for a treble boost control and toward the imaginary axis for a base boost control.

Figure 7:
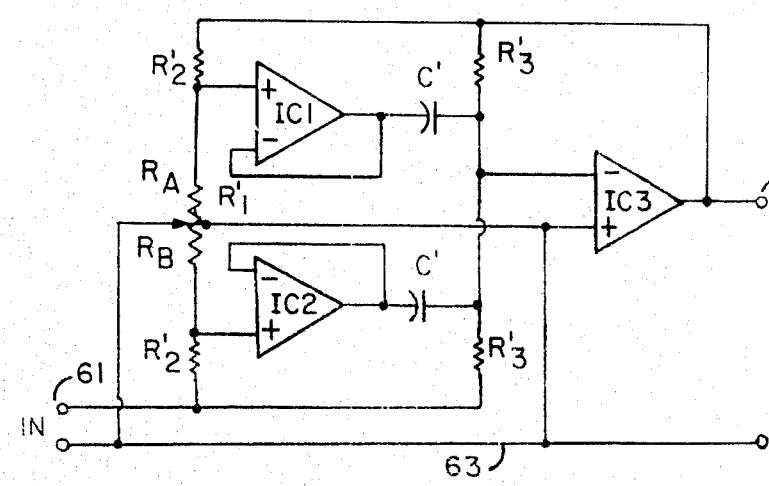
FIG. 7 is a schematic circuit diagram of an exemplary embodiment of the invention as a treble tone control providing both boost and cut.

Referring to FIG. 7, there is shown a schematic circuit diagram of an exemplary embodiment of the invention which provides both boost and cut. When the wiper of potentiometer $R_1'$ is in the center, the transfer characteristic of the circuitry between input terminal 61 and output terminal 62 relative to common line 63 is substantially uniform. This response results from having both a pole and zero located at 1 kHz on the real axis. As the wiper moves upward, the pole moves away from the origin while the zero remains stationary, causing treble boost. As the wiper moves downward on the schematic, the zero moves away from the origin while the pole remains stationary, thereby causing treble cut.

The function of this circuit could be closely approximated by making $R_1'$ and $R_2'$ small compared to resistor $R_3'$ and omitting operational amplifier IC1 and IC2. With the circuit as shown, the realization is essentially exact. By replacing the capacitors C' with inductors, or alternatively by converting operational amplifier IC1 and IC2 from followers to integrators and replacing the capacitors C' with resistors, the circuit may function as a bass control providing both boost and cut.

There has been described novel apparatus and techniques for providing improved tone controls that may be easily fabricated with relatively few components that are relatively inexpensive. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended.

What is claimed is:

1. Fixed bandpass tone controlling apparatus comprising, circuit means for establishing a transfer function characterized by a zero and a pole on the real axis in the complex frequency plane each spaced from the imaginary axis by a distance corresponding to an audible frequency, and said circuit means including means for maintaining one of said pole and said zero fixed on said real axis while selectively moving the other along said real axis between a first position near the stationary one of said pole and said zero and a second position away from said stationary one of said pole and zero, wherein said first position corresponds to that of said stationary one of said zero and said pole at substantially 1,000 Hz and said second position is always further from the center frequency of the audible spectrum corresponding substantially to 800 Hz than said first position.

2. Fixed bandpass tone controlling apparatus in accordance with claim 1 wherein said second position is further from said imaginary axis than said first position.

3. Fixed bandpass tone controlling apparatus in accordance with claim 1 and including means for maintaining said zero stationary.

4. Fixed bandpass tone controlling apparatus in accordance with claim 1 and further comprising,
potentiometer means having first and second ranges,
means associated with said potentiometer means being in said first range for maintaining said pole stationary while selectively moving said zero along said real axis between said first position and a second position further from said imaginary axis,
and means associated with said second range for maintaining said zero fixed on said real axis while selectively moving said pole along said real axis between said first position and said second position.

* * * * *